United States Patent  (10) Patent No.: US 9,786,719 B2
Rigano et al.  (45) Date of Patent: Oct. 10, 2017

(54) METHOD FOR BASE CONTACT LAYOUT, SUCH AS FOR MEMORY

(75) Inventors: Antonino Rigano, Pioltello (IT); Fabio Pellizzer, Cornate d'Adda (IT); Gianfranco Capetti, Concorezzo (IT)

(73) Assignee: MICRON TECHNOLOGY, INC., Boise, ID (US)

(*) Notice: Subject to any disclaimer, the term of this patent is extended or adjusted under 35 U.S.C. 154(b) by 750 days.

(21) Appl. No.: 13/414,329

(22) Filed: Mar. 7, 2012

(65) Prior Publication Data

US 2013/0235654 A1  Sep. 12, 2013

(51) Int. Cl.
*H01L 21/70* (2006.01)
*H01L 27/11* (2006.01)
*H01L 27/24* (2006.01)
*H01L 45/00* (2006.01)
*H01L 27/10* (2006.01)

(52) U.S. Cl.
CPC ........ *H01L 27/2436* (2013.01); *H01L 27/101* (2013.01); *H01L 27/2463* (2013.01); *H01L 45/06* (2013.01); *H01L 45/1233* (2013.01)

(58) Field of Classification Search
CPC ...... H01L 45/141–45/144; H01L 45/04; H01L 45/08; H01L 45/085; H01L 45/1266; H01L 45/06; H01L 45/065
USPC ........................... 257/529, E21.068, E45.002
See application file for complete search history.

(56) References Cited

U.S. PATENT DOCUMENTS

| 6,064,592 | A | * | 5/2000 | Nakagawa | ......... G11C 16/0416 257/E21.682 |
| 6,538,270 | B1 | * | 3/2003 | Randolph | ......... H01L 27/11568 257/208 |
| 6,593,606 | B1 | * | 7/2003 | Randolph | ............. H01L 27/115 257/202 |
| 7,054,219 | B1 | * | 5/2006 | Petti et al. | ................ 365/230.06 |
| 7,847,373 | B2 | | 12/2010 | Pirovano et al. | |
| 7,875,513 | B2 | | 1/2011 | Pellizzer et al. | |
| 2006/0018181 | A1 | * | 1/2006 | Matsunaga | ......... H01L 27/0207 365/230.05 |
| 2008/0259677 | A1 | * | 10/2008 | Pirovano | .............. G11C 13/003 365/163 |
| 2010/0006816 | A1 | * | 1/2010 | Magistretti | ......... H01L 27/1022 257/5 |
| 2010/0059829 | A1 | | 3/2010 | Pellizzer et al. | |
| 2011/0084247 | A1 | | 4/2011 | Pellizzer et al. | |
| 2011/0159682 | A1 | * | 6/2011 | Yang | ................. H01L 21/76802 438/599 |
| 2011/0248382 | A1 | * | 10/2011 | Pellizzer | ............. H01L 27/1022 257/539 |

FOREIGN PATENT DOCUMENTS

WO  WO2010/076825  *  7/2010  ......... H01L 21/0338

* cited by examiner

*Primary Examiner* — Jesse Y Miyoshi
(74) *Attorney, Agent, or Firm* — Holland & Hart LLP

(57) ABSTRACT

Embodiments disclosed herein may relate to forming a base contact layout in a memory device.

16 Claims, 4 Drawing Sheets

METHOD FOR BASE CONTACT LAYOUT, SUCH AS FOR MEMORY

BACKGROUND

Field

Subject matter disclosed herein may relate to integrated circuit devices, and may relate, more particularly, to memory-related circuitry.

Information

Integrated circuit devices, such as memory devices, for example, may be found in a wide range of electronic devices. For example, memory devices may be used in computers, digital cameras, cellular telephones, personal digital assistants, etc. Factors related to a memory device that may be of interest to a system designer in considering suitability for any particular application may include, physical size, storage density, operating voltages, granularity of read/write operations, throughput, transmission rate, and/or power consumption, for example. Other example factors that may be of interest to system designers may include cost of manufacture and/or ease of manufacture.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

Reference is made in the following detailed description to accompanying drawings, which form a part hereof, wherein like numerals may designate like parts throughout to indicate corresponding and/or analogous components. It will be appreciated that components illustrated in the figures have not necessarily been drawn to scale, such as for simplicity and/or clarity of illustration. For example, dimensions of some components may be exaggerated relative to other components. Further, it is to be understood that other embodiments may be utilized. Furthermore, structural and/or other changes may be made without departing from the scope of claimed subject matter. It should also be noted that directions and/or references, for example, up, down, top, bottom, and so on, may be used to facilitate discussion of drawings and/or are not intended to restrict application of claimed subject matter. Therefore, the following detailed description is not to be taken to limit the scope of claimed subject matter and/or equivalents.

DETAILED DESCRIPTION

Figure 1:
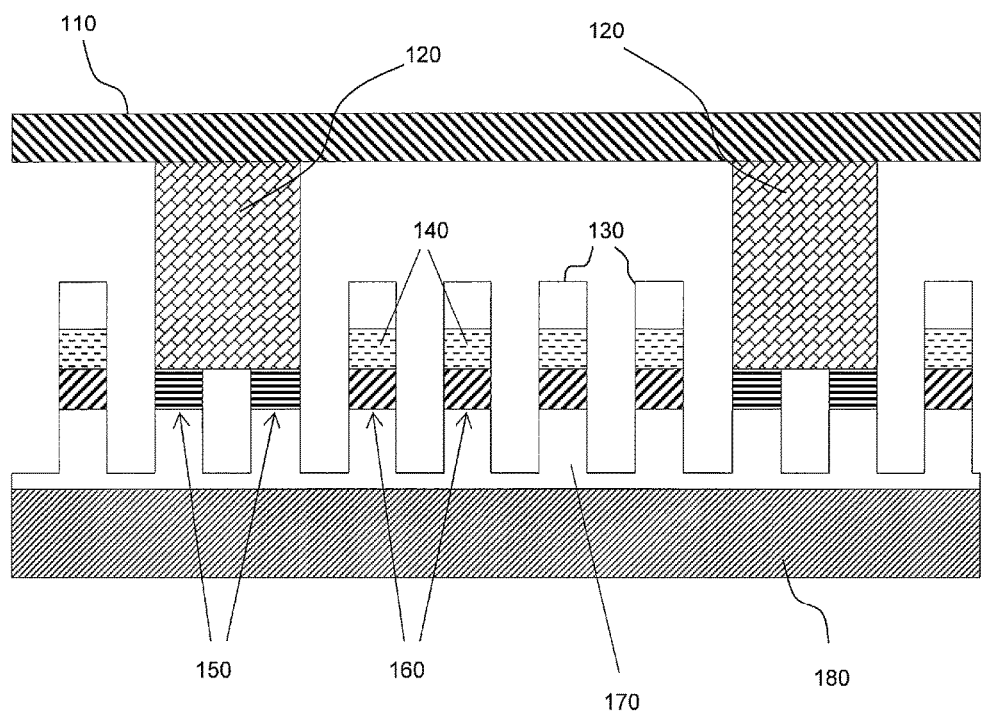
FIG. 1 is an illustration depicting a cross-sectional view of a memory device, such as a PCM device, according to an embodiment.

FIG. 1 is an illustration depicting a cross-sectional view of an embodiment 100 of a memory device comprising a phase change memory (PCM) device formed over a surface of a substrate (not shown). In an embodiment, a memory device, such as device 100, may employ one or more select devices, for example diodes or transistors, such as one or more bipolar junction transistors, as selectors for individual memory cells. For example, a memory device, such as 100, may comprise one or more transistors including one or more collector components, such as collector 180, one or more base components, such as base 170, and one or more emitter components, such as one or more emitters 160. In an embodiment, an emitter, base, and collector combination may form one or more bipolar junction transistors, for example. In an embodiment, a base 170, a collector 180, and one or more emitters 160, may comprise one or more transistors, wherein a base component, such as base 170, and a collector component, such as collector 180, may be common across one or more transistors, although claimed subject matter is not limited in scope in these respects.

In an embodiment, a memory cell, such as phase change memory cell 140, may be selected, such as by use of sufficient and/or appropriate signals, such as voltage signals, with a first electrode, such as an access line (word line) 110, and/or with a second electrode, such as a data/sense line (bit line) 130.

An electrically conductive component, such as an "electrode," refers to component that may be utilized to route signals and/or supply power within a memory array. An electrode may comprise a sufficiently electrically conductive material, such as polysilicon, carbon, and/or metallic material, such as tungsten, titanium nitride, and/or titanium aluminum nitride, for example, for use in a memory device. Example electrically conductive components may include, for example, base interconnects 120, base contacts 150, word line 110, and/or bit lines 130. Of course, claimed subject matter is not limited in scope in these respects. Other materials may, of course, also be used in an embodiment.

In an embodiment, a voltage signal may be used in conjunction with an electrode and may be used in conjunction with a base component via one or more electrically conductive components, such as an interconnect and/or a contact. Also, in an embodiment, a voltage signal for a base component may be employed with one or more emitters and a collector component. In an embodiment, a particular storage component, such as a particular phase change memory cell 140, may be accessed at least in part by use of appropriate voltage signal levels for a first electrode and/or for a second electrode, for example. A voltage signal may be employed to energize one or more bipolar transistors, for example. In an embodiment, an electrically conductive component may comprise tungsten, although claimed subject matter is not limited in this respect.

For a memory device, such as 100, a memory cell, such as phase change memory (PCM) cell 140, may comprise a chalcogenide glass material, in an embodiment. A PCM cell, for example, may have a configuration to retain or store a memory state comprising one of at least two different selectable states. In a binary system, states may comprise a binary "0" value or a binary "1" value, where a "set" state, representing a binary value of '1', for example, may correspond to a more crystalline, more conductive state for a PCM material and a "reset" state, representing a binary value of '0', for example, may correspond to a more amorphous, more resistive state. In other systems, at least some individual memory cells may have a configuration to store more than two levels or states. In a PCM array, heat sufficient to change a phase of a memory cell may be achieved by use of a current and/or voltage pulse. Further, in one or more example embodiments, memory devices may comprise one or more technologies other than PCM, such as resistive memory technologies and/or other types of memory, and claimed subject matter is not limited in scope in this respect.

For example, as depicted in FIG. 1, a base 170 may be patterned. For example, one or more trenches may be formed so as to be positioned in a semiconductor material in a direction approximately orthogonal to word-line 110. A shallow-trench isolation structure (STI) may be implemented, although claimed subject matter is not limited in scope in this respect. Also, base component 170 may be formed at least in part by epitaxy, although claimed subject matter is not limited in scope in this respect. For example, a solid epitaxial material of n-doped silicon may be formed, such as by vapor phase deposition, over collector material 180. Base component 170 may be heavily doped, such as with an n-buried implant, for example, to reduce resistance of base 170. Also, one or more trenches in accordance with an STI implementation may be formed in the base at least in part by a plasma etch process, although again claimed subject matter is not limited in scope in these respects.

To create a more dense memory array, tolerances among electrode dimensions and/or bipolar junction transistor interconnections may become more stringent. For example, an interconnect and/or a contact may connect to an electrode with a tolerance that may approximately comprise a width of word-line 110, as an example. Also, the width of word-line 110 may represent a reduced-size dimension approaching limits of state-of-the-art photolithographic manufacturing techniques. As feature dimensions of components are reduced in an effort to increase memory array densities, it may be more difficult to reliably accomplish a connection between a base and an electrode in a device topology, such as in an STI topology, for example. However, by staggering base contacts in a manner depicted in FIG. 2, for example, or in a similar manner, tolerances may be relaxed and adequate connections between an electrode and a base may be maintained. Also, by staggering base contacts in a manner depicted in FIG. 2, for example, or in a similar manner, connections between an electrode and a base component may be made in a more reliable manner, in accordance with one or more embodiments.

Figure 2:
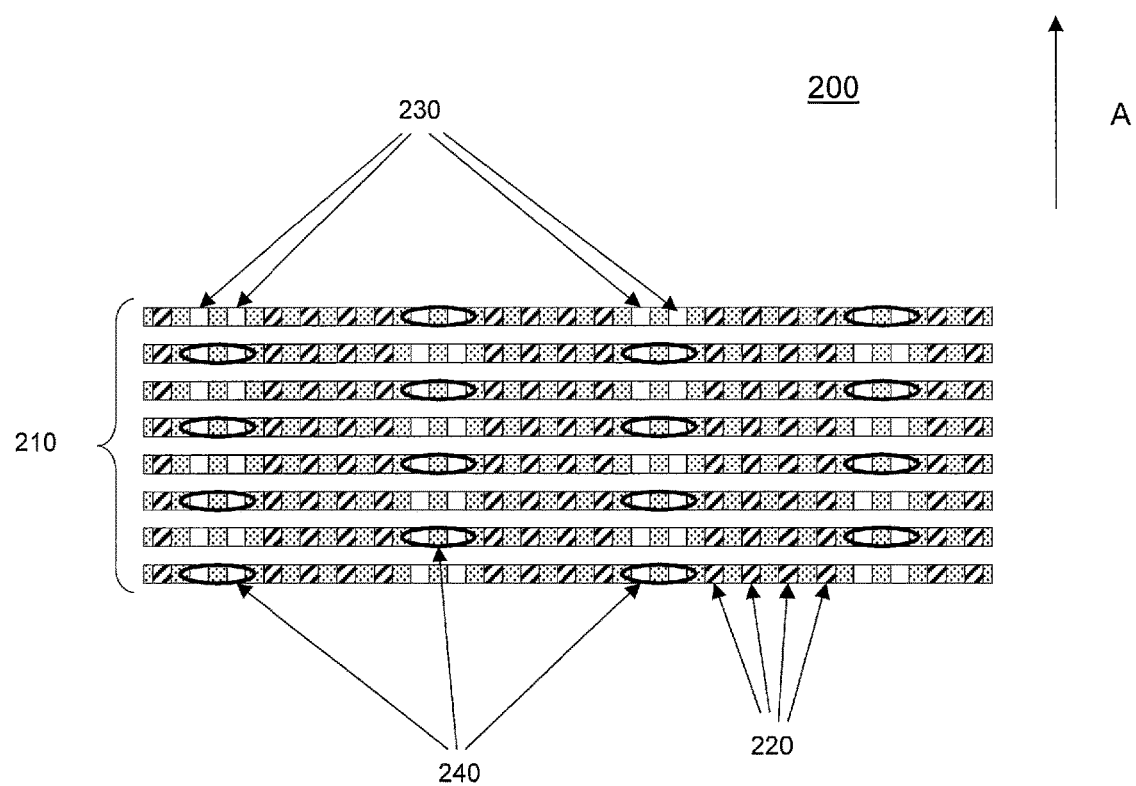
FIG. 2 is an illustration depicting a top view of a portion of a memory device, according to an embodiment.

FIG. 2 is an illustration depicting a top view of a portion of an embodiment 200 of a memory device. A memory device, such as PCM device 200, may comprise one or more electrodes, such as word-lines 210. A plurality of electrodes, such as word-lines 210, may be positioned approximately in parallel, and positioned in a direction approximately orthogonal to a plurality of bit-lines (not shown) for an array of memory cells, such as an array of phase change memory cells. Also, word-lines 210 may be positioned over an array of memory cells in accordance with an arrangement, such as an STI arrangement, although claimed subject matter is not limited in scope in this respect. For example, an array of memory cells may comprise an arrangement similar to that depicted in FIG. 1.

Also depicted in FIG. 2 are base contact areas 230 and emitter contact areas 220 at a common depth. Base contact areas may be positioned below word-lines 210. Referring again to FIG. 1, base contacts 150 may be positioned below word-line 110. Similarly, emitter contacts 160 may be located below word-line 110. Of course, base contacts 150 may be electrically coupled, directly or indirectly, to a word-line by way of an electrically conductive connector. Emitter contacts 160, on the other hand, may not be directly electrically coupled to word-line 210, but may instead be directly coupled to a memory cell, such as phase change memory cells 140, and in turn indirectly electrically coupled to an electrode, such as bit-line 130. It is noted that in this context the terms "connected" and "directly coupled" may be viewed as interchangeable. These refer to direct physical coupling or direct physical contact, such as between two components. Also, two components may be indirectly electrically coupled if a third component permits electrical coupling between the two components in a situation in which the two components are not in direct physical contact.

In FIG. 2, areas at which emitters 160 may electrically connect to memory cells 140, and to bit-lines 130, may be represented by emitter contact areas 220. Also, base contact areas 230 may represent areas below word-lines 210, and may not represent areas at which base contacts may be electrically connected to word-lines 210. Rather, as depicted in FIG. 2, areas at which base interconnect 120 may electrically connect base contact 150 to a word-line 210 may be represented by base interconnect areas 240 having an arrangement in accordance with a base contact layout.

In an embodiment, base interconnect areas 240 may comprise areas having a length dimension that may comprise approximately three times that of a width of word-line 210. Claimed subject matter is not limited in scope in this respect. Other dimensions would also be adequate; however, a factor of three may be convenient in some situations. By increasing a length dimension of a base interconnect area, such as one or more of base interconnect areas 240, an electrically conductive contact area between an interconnect and an electrode may be increased. An increase in direct physical contact between electrically conductive components, such as between a base interconnect and a word-line, may reduce electrical resistance at a junction, for example.

Additionally, a pattern of alternating base interconnect areas 240 in a staggered fashion may be utilized, such that base contact areas are not located side-by-side on immediately adjacent word-lines. For example, looking in a direction substantially orthogonal to the word-lines, such as direction A shown in FIG. 2, base interconnect areas 240 are not located side-by side on immediately adjacent word-lines. Also, base interconnect areas 240 may alternate along individual word-lines, as depicted in FIG. 2. For example, a first pair of base contact areas 230 along a particular word-line 210 may typically not be electrically connected to word-line 210 via a base interconnect area 240. Additionally, a next pair of base contact areas 230 along a particular word-line may be electrically connected to word-line 210 via a base interconnect area 240. As depicted in FIG. 2, for immediately adjacent word-lines 210, a pattern of base interconnect areas 240 may be "out-of-phase" such that pairs of base interconnect areas 240 on immediately adjacent word-lines do not coincide with each other. By alternating base interconnect areas 240 along a word-line and/or by alternating base interconnect areas 240 for immediately adjacent word-lines, constraints on base interconnect and electrode junctions may be relaxed due at least in part to a reduced risk of a misaligned base interconnect. For example, this may improve device performance by reducing and/or preventing shorting against an immediately adjacent word-line. Base interconnects 120 may be fabricated such that boundaries of individual base interconnects may exceed a width of a particular electrode by approximately a width of a particular electrode without incurring an unacceptable high risk of resulting in a short with an electrode.

Figure 3:
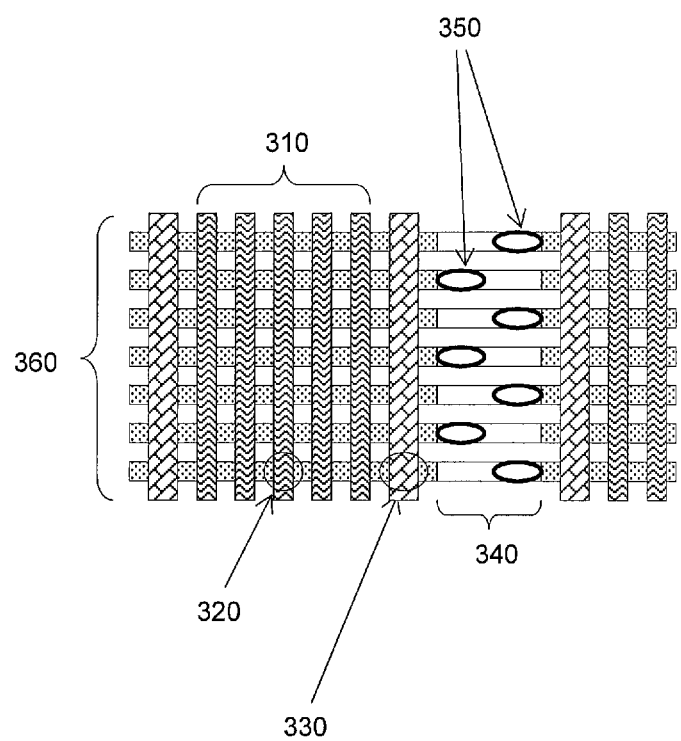
FIG. 3 is an illustration depicting a top view of a portion of a memory device, according to an embodiment.

FIG. 3 is an illustration depicting a top view of a portion of an example NAND flash memory device 300. NAND flash memory device 300 may comprise one or more electrodes, such as word-lines 310 that may be positioned approximately in parallel and in a direction approximately orthogonal to a plurality of bit-lines 360.

Also depicted in FIG. 3 are memory cell areas 320, positioned at intersections of word-lines 310 and bit-lines 360. Additionally, FIG. 3 depicts drain MOS selectors 330 and drain contact regions 340. It may be noted that FIG. 3 depicts a portion of a NAND flash memory cell array.

Drain contact regions 340 may represent areas below bit-lines 360, and may not necessarily represent areas at which drain contacts may be electrically connected to bit-lines 360. Rather, as depicted in FIG. 3, areas at which a drain contact may electrically connect to a drain contact region 340 of a bit-line 360 may be represented by drain connector areas 350.

As depicted in FIG. 3, drain connector areas 350 may be located on drain contact regions 340. Drain contact regions 340 may be positioned side-by-side or nearly so on immediately adjacent bit-lines, as depicted in FIG. 3. This is in contrast to embodiments described herein, such as described above in connection with FIG. 2. As depicted in FIG. 3, a first drain connector 350 may be positioned in an area relative to a first side of a particular drain contact region 340 along a particular bit-line 360, and a second drain connector 350 may be positioned in an area relative to a second side of a drain connector region 340 on an immediately adjacent bit-line 360. In FIG. 2, an embodiment is depicted wherein a pattern of alternating base interconnect areas 240 may be utilized. For example, base contact areas and/or base interconnect areas may not be located side-by-side on immediately adjacent word-lines. Also, base interconnect areas 240 may alternate along individual word-lines, as depicted in FIG. 2.

Figure 4:
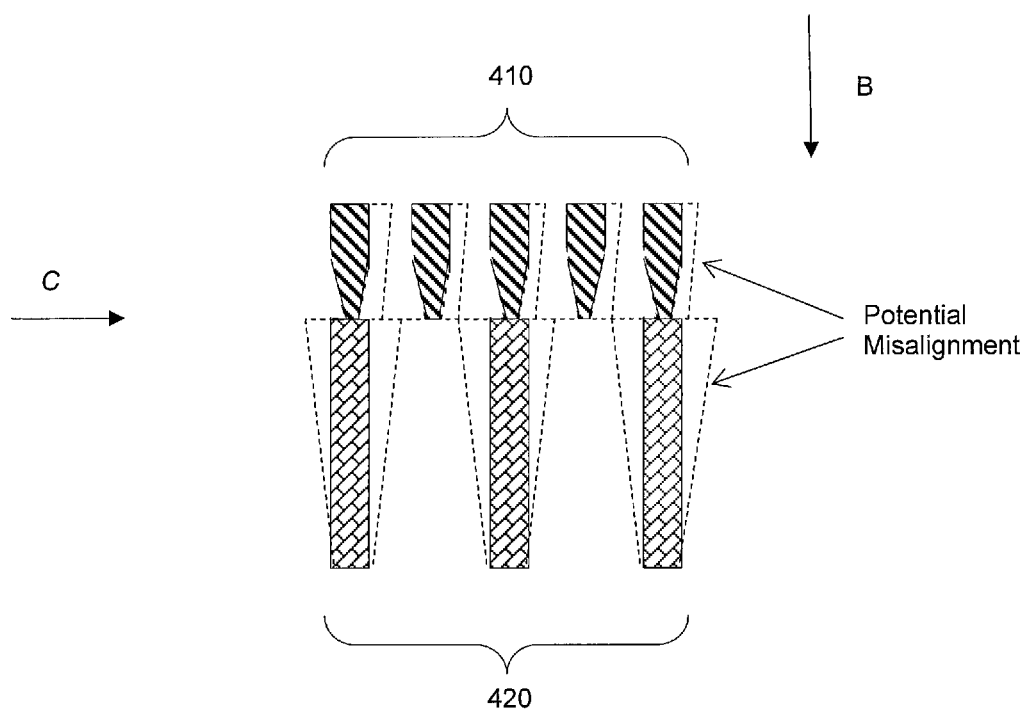
FIG. 4 is an illustration depicting a cross-sectional view of a portion of a memory device, according to an embodiment.

FIG. 4 is an illustration depicting a cross-sectional view of a portion of a memory device, including a plurality of electrodes 410 and a plurality of electrically conductive connectors 420, according to an embodiment. Electrodes 410 may comprise a plurality of word-lines, similar to word-lines 210, for example. Electrodes 410 may comprise a plurality of bit-lines. However, claimed subject matter is not limited in scope in these respects. Also, electrically conductive connectors 420 may comprise a plurality of base interconnects; similar to base interconnects 120, for example.

As illustrated in FIG. 4, individual electrodes 410 may have a tapered cross-section, such as along direction B, such that a bottom portion of an individual electrode may be narrower in width than a top portion of an individual electrode. Tapering of electrodes 410 decrease potential misalignment with connector 420 during processing. Additionally, electrodes 410 having a tapered cross-section may decrease the risk of shorting against one or more electrodes. One or more tapered electrodes may be utilized in implementations that utilize a base contact layout including one or more staggered base interconnect and/or base connector patterns, such as one or more patterns described above in connection with example embodiments depicted in FIGS. 1-3, for example. For example, a staggered base interconnect pattern may comprise a nested base interconnect pattern, so that perimeters of base contacts laying in a plane, such as plane C in FIG. 4, may be nested with an area of overlap, such as if viewed from a plane perspective looking along direction B at plane C. However, claimed subject matter is not so limited.

The terms, "and", "or", and "and/or" as used herein may include a variety of meanings that also are expected to depend at least in part upon the context in which such terms are used. Typically, "or" if used to associate a list, such as A, B or C, is intended to mean A, B, and C, here used in the inclusive sense, as well as A, B or C, here used in the exclusive sense. In addition, the term "one or more" as used herein may be used to describe any feature, structure, and/or characteristic in the singular and/or may be used to describe a plurality or some other combination of features, structures and/or characteristics. Though, it should be noted that this is merely an illustrative example and claimed subject matter is not limited to this example.

In the preceding detailed description, numerous specific details have been set forth to provide a thorough understanding of claimed subject matter. However, it will be understood by those skilled in the art that claimed subject matter may be practiced without these specific details. In other instances, methods and/or apparatuses that would be known by one of ordinary skill have not been described in detail so as not to obscure claimed subject matter.

Some portions of the preceding detailed description have been presented in terms of logic, algorithms and/or symbolic representations of operations on binary states stored within a memory of a specific apparatus or special purpose computing device or platform. In the context of this particular specification, the term specific apparatus or the like includes a general purpose computing device, such as general purpose computer, once it is programmed to perform particular functions pursuant to instructions from program software. Algorithmic descriptions and/or symbolic representations are examples of techniques used by those of ordinary skill in the signal processing and/or related arts to convey the substance of their work to others skilled in the art. An algorithm is here, and generally, is considered to be a self-consistent sequence of operations and/or similar signal processing leading to a desired result. In this context, operations and/or processing involve physical manipulation of physical quantities. Typically, although not necessarily, such quantities may take the form of electrical and/or magnetic signals and/or states capable of being stored, transferred, combined, compared or otherwise manipulated as electronic signals and/or states representing information. It has proven convenient at times, principally for reasons of common usage, to refer to such signals and/or states as bits, data, values, elements, symbols, characters, terms, numbers, numerals, information, and/or the like. It should be understood, however, that all of these or similar terms are to be associated with appropriate physical quantities and are merely convenient labels. Unless specifically stated otherwise, as apparent from the following discussion, it is appreciated that throughout this specification discussions utilizing terms such as "processing," "computing," "calculating," "determining", "establishing", "obtaining", "identifying", "selecting", "generating", and/or the like may refer to actions and/or processes of a specific apparatus, such as a special purpose computer and/or a similar special purpose computing device. In the context of this specification, therefore, a special purpose computer and/or a similar special purpose computing device is capable of manipulating and/or transforming signals and/or states, typically represented as physical electronic and/or magnetic quantities within memories, registers, and/or other information storage devices, transmission devices, and/or display devices of the special purpose computer and/or similar special purpose computing device. In the context of this particular patent application, the term "specific apparatus" may include a general purpose computing device, such as a general purpose computer, once it is programmed to perform particular functions pursuant to instructions from program software.

In some circumstances, operation of a memory device, such as a change in state from a binary one to a binary zero or vice-versa, for example, may comprise a transformation, such as a physical transformation. With particular types of memory devices, such a physical transformation may comprise a physical transformation of an article to a different state or thing. For example, but without limitation, for some types of memory devices, a change in state may involve an accumulation and/or storage of charge or a release of stored charge. Likewise, in other memory devices, a change of state may comprise a physical change, such as a transformation in magnetic orientation and/or a physical change or transformation in molecular structure, such as from crystalline to amorphous or vice-versa. In still other memory devices, a change in physical state may involve quantum mechanical phenomena, such as, superposition, entanglement, and/or the like, which may involve quantum bits (qubits), for example. The foregoing is not intended to be an exhaustive list of all examples in which a change in state form a binary one to a binary zero or vice-versa in a memory device may comprise a transformation, such as a physical transformation. Rather, the foregoing is intended as illustrative examples.

A computer-readable (storage) medium typically may be non-transitory and/or comprise a non-transitory device. In this context, a non-transitory storage medium may include a device that is tangible, meaning that the device has a concrete physical form, although the device may change its physical state. Thus, for example, non-transitory refers to a device remaining tangible despite a change in state.

While there has been illustrated and/or described what are presently considered to be example features, it will be understood by those skilled in the art that various other modifications may be made and/or equivalents may be substituted, without departing from claimed subject matter. Additionally, many modifications may be made to adapt a particular situation to the teachings of claimed subject matter without departing from the central concept(s) described herein.

Therefore, it is intended that claimed subject matter not be limited to the particular examples disclosed, but that such claimed subject matter may also include all aspects falling within the scope of appended claims and/or equivalents thereof.

The invention claimed is:

1. A method, comprising:
    forming a base contact layout for a memory array, the layout comprising:
        a plurality of word-line interconnect portions extending continuously in a first direction alongside one another, each word-line interconnect portion tapering from a first width to a second width less than the first width; and
        a pattern of base interconnect areas for the plurality of word-line interconnect portions, wherein each word-line interconnect portion has a plurality of associated base interconnect areas, wherein at least one base interconnect area contacts a first pair of base contact pillars, wherein a second pair of base contact pillars different than the first pair of base contact pillars is positioned between base interconnect areas located along a second direction different from the first direction, the second pair of base contact pillars being separated from the plurality of word-line interconnect portions, each base interconnect area having a first dimension extending in the first direction that is at least three times larger than the second width of the word-line interconnect portions, the second width extending in the second direction; and
        wherein each base interconnect area is longer along the first direction than along the second direction.

2. The method of claim 1, further comprising forming one or more selector transistors corresponding to one or more memory cells of the memory array, wherein the one or more selector transistors individually comprise a base component corresponding to a respective base interconnect area.

3. The method of claim 2, wherein the one or more selector transistors comprise one or more bipolar junction transistors.

4. The method of claim 3, wherein the forming the one or more selector transistors comprises forming the base component at least in part by depositing an epitaxial semiconductor material over a collector material.

5. The method of claim 4, wherein the depositing the epitaxial semiconductor material comprises depositing a silicon material over the collector material.

6. The method of claim 5, wherein the depositing the silicon material over the collector material comprises depositing the silicon material over the collector material that is later to be n-doped.

7. The method of claim 4, wherein the forming the one or more selector transistors further comprises forming one or more trenches in the epitaxial semiconductor material.

8. The method of claim 7, wherein the forming the one or more trenches in the epitaxial semiconductor material comprises forming the one or more trenches in accordance with a shallow-trench isolation configuration.

9. The method of claim 1, wherein forming the base contact layout comprises forming isolation trenches immediately adjacent and on opposing sides of the base interconnect areas, the isolation trenches elongated in a bit-line direction.

10. The method of claim 9, wherein further comprising forming memory cells on the opposing sides of the base interconnect areas, the memory cells immediately adjacent the isolation trenches.

11. The method of claim 1, wherein the first direction comprises:
    a word-line direction.

12. The method of claim 1, wherein the second direction comprises:
    a bit-line direction.

13. The method of claim 1, wherein at least some of the word-line interconnect portions taper downward.

14. The method of claim 1, wherein at least one base interconnect area is in electronic communication with a memory cell of the memory array.

15. The method of claim 1, wherein the second pair of base contact pillars is associated with a first word-line interconnect portion, and wherein one of the base interconnect areas located along the second direction is associated with a second word-line interconnect portion different from the first word-line interconnect portion.

16. The method of claim 1, wherein the first pair of base contact pillars is electrically coupled to the plurality of word-line interconnect portions via the at least one base interconnect area.

* * * * *